United States Patent
Suemitsu et al.

(10) Patent No.: US 8,688,059 B2
(45) Date of Patent: Apr. 1, 2014

(54) WIRELESS BASE STATION WITH INTERNAL CLOCK CORRECTION

(75) Inventors: Taisei Suemitsu, Tokyo (JP); Kuniyuki Suzuki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 210 days.

(21) Appl. No.: 13/144,005

(22) PCT Filed: Oct. 22, 2009

(86) PCT No.: PCT/JP2009/068172
§ 371 (c)(1),
(2), (4) Date: Jul. 11, 2011

(87) PCT Pub. No.: WO2010/122686
PCT Pub. Date: Oct. 28, 2010

(65) Prior Publication Data
US 2011/0274227 A1 Nov. 10, 2011

(30) Foreign Application Priority Data
Apr. 24, 2009 (JP) ................................. 2009-106317

(51) Int. Cl.
| | |
|---|---|
| *H03C 1/62* | (2006.01) |
| *H04B 7/00* | (2006.01) |
| *H04B 7/185* | (2006.01) |
| *H04B 5/00* | (2006.01) |
| *H03G 3/30* | (2006.01) |

(52) U.S. Cl.
CPC .................................. *H03G 3/3042* (2013.01)
USPC ..... 455/115.1; 455/12.1; 455/41.1; 455/41.2; 455/509; 340/539.1; 375/362; 709/224; 710/305

(58) Field of Classification Search
USPC .................... 455/12.01, 115, 41.1, 41.2, 509; 348/333.02; 710/305; 709/229; 360/371; 375/362; 340/539.1
See application file for complete search history.

(56) References Cited

U.S. PATENT DOCUMENTS 5,839,059 A * 11/1998 Hakkinen et al. .......... 455/115.1
5,987,556 A * 11/1999 Nakagawa et al. ........... 710/305
6,072,652 A * 6/2000 Lee .................................. 360/71
(Continued)

FOREIGN PATENT DOCUMENTS

| | | |
|---|---|---|
| CN | 101076940 A | 11/2007 |
| CN | 101112110 A | 1/2008 |

(Continued)

OTHER PUBLICATIONS

Japanese Decision of Refusal issued Jul. 17, 2012, in Japan Patent Application No. 2011-510150 (with Partial English translation).

(Continued)

*Primary Examiner* — William D Cumming
(74) *Attorney, Agent, or Firm* — Oblon, Spivak, McClelland, Maier & Neustadt, L.L.P.

(57) ABSTRACT

A wireless base station that performs wireless communication with a mobile terminal is connected to a plurality of time information notification servers. The wireless base station selects any of a plurality of pieces of time information notified from a plurality of time information notification servers, respectively, and corrects an internal clock based on the selected piece of time information. This can keep the internal clock of the wireless base station highly accurate.

7 Claims, 11 Drawing Sheets

(56) References Cited

U.S. PATENT DOCUMENTS

| | | | |
|---|---|---|---|
| 7,409,187 B2* | 8/2008 | Taniguchi | 455/12.1 |
| 7,840,228 B2 | 11/2010 | Suemitsu et al. | |
| 7,853,207 B2* | 12/2010 | Harada et al. | 455/41.1 |
| 8,004,593 B2* | 8/2011 | Kusaka | 348/333.02 |
| 2005/0177591 A1 | 8/2005 | Kanda et al. | |
| 2006/0178107 A1* | 8/2006 | Taniguchi | 455/12.1 |
| 2006/0229014 A1* | 10/2006 | Harada et al. | 455/41.2 |
| 2007/0024437 A1* | 2/2007 | Nelson et al. | 340/539.1 |
| 2007/0262934 A1* | 11/2007 | Fujikawa et al. | 345/82 |
| 2008/0068486 A1* | 3/2008 | Kusaka | 348/333.02 |
| 2008/0106342 A1* | 5/2008 | Okamoto et al. | 331/18 |
| 2008/0145020 A1* | 6/2008 | Tsuruga | 386/65 |
| 2009/0181709 A1* | 7/2009 | Shimomura et al. | 455/509 |
| 2011/0274227 A1* | 11/2011 | Suemitsu et al. | 375/362 |
| 2012/0084439 A1* | 4/2012 | Fukuyama et al. | 709/224 |

FOREIGN PATENT DOCUMENTS

| | | |
|---|---|---|
| JP | 10-20052 | 1/1998 |
| JP | 10-340128 | 12/1998 |
| JP | 2005-222368 | 8/2005 |
| JP | 2006-349364 | 12/2006 |
| JP | 2008-182385 | 8/2008 |
| WO | WO 2006/064572 A1 | 6/2006 |
| WO | WO 2006/082628 A1 | 8/2006 |

OTHER PUBLICATIONS

Japanese Office Action issued Apr. 24, 2012, in Japan Patent Application No. 2011-510150 (with English translation).

International Preliminary Report on Patentability with English Translation issued Nov. 3, 2011, in PCT Application No. PCT/JP2009/068172.

International Search Report issued Nov. 17, 2009, in Patent Application No. PCT/JP2009/068172.

David L. Mills. "Network Time Protocol (Version 3) Specification, Implementation and Analysis", The Internet Engineering Task Force, Mar. 1992, pp. 5-7.

"3rd Generatin Partnership project; Technology Specification Group Radio Access Network; Base Station (BS) conformance testing (FDD) (Release 1999)", 3GPP TS 25.141 Technical Specification, V3.13.0, Mar. 2003, Cover page and pp. 34-35.

David L. Mills. "Network Time Protocol (Version 3) Specification, Implementation and Analysis", The Internet Engineering Task Force, Mar. 1992, pp. 34-40).

Office Action (with English translation) issued on Sep. 22, 2013, in counterpart Chinese Appln No. 200980158879.X (19 pages).

* cited by examiner

|  | COUNT VALUE USING MASTER CLOCK OF BASE STATION | DIFFERENCE FROM INSIDE OF BASE STATION |
|---|---|---|
| INSIDE OF BASE STATION (1-1) | 10000 [CLOCKS] | — |
| NTP SERVER (1-2) | 9999 [CLOCKS] | −1 [CLOCKS] |
| NTP SERVER (1-3) | 9999 [CLOCKS] | −1 [CLOCKS] |
| NTP SERVER (1-4) | 10300 [CLOCKS] | +300 [CLOCKS] |

|  | COUNT VALUE USING MASTER CLOCK OF BASE STATION | DIFFERENCE FROM INSIDE OF BASE STATION |
|---|---|---|
| INSIDE OF BASE STATION (1-1) | 10000 [CLOCKS] | — |
| NTP SERVER (1-2) | 9998 [CLOCKS] | -2 [CLOCKS] |
| NTP SERVER (1-3) | 9999 [CLOCKS] | -1 [CLOCKS] |
| NTP SERVER (1-4) | 10300 [CLOCKS] | +300 [CLOCKS] |

F I G. 5
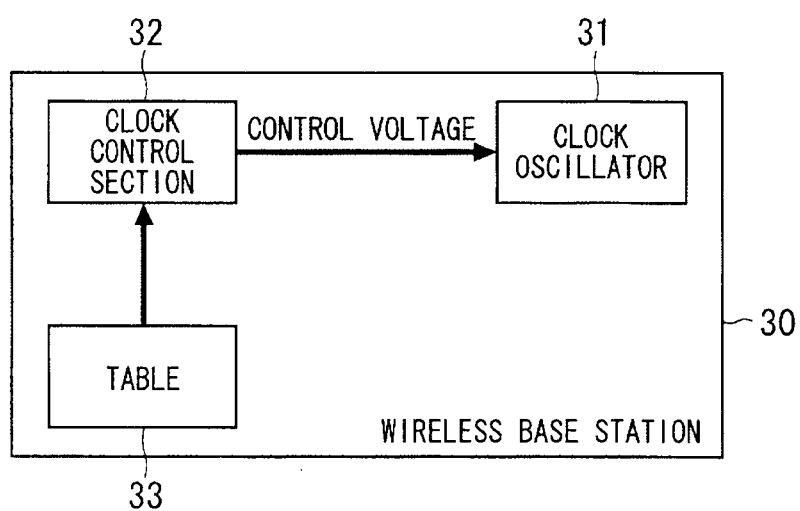

| TIME | FREQUENCY ERROR[GHz] |
|---|---|
| 0 | +0.000015 |
| 1 | +0.000013 |
| 2 | +0.000009 |
| ⋮ | ⋮ |
| t | +0.000003 |
| ⋮ | ⋮ |
| T | +0.000000 |

F I G . 9

| TIME | CONTROL VOLTAGE [V] |
|------|---------------------|
| 0    | −0.015              |
| 1    | −0.013              |
| 2    | −0.009              |
| ⋮    | ⋮                   |
| t    | −0.003              |
| ⋮    | ⋮                   |
| T    | +0.000              |

FIG. 10

| TIME | FREQUENCY ERROR [GHz] | CONTROL VOLTAGE [V] | COUNT VALUE BASED ON MASTER CLOCK (C0) | COUNT VALUE BASED ON FIRST REFERENCE TIME INFORMATION (C1) | COUNT VALUE BASED ON SECOND REFERENCE TIME INFORMATION (C2) |
|---|---|---|---|---|---|
| 0 | +0.000015 | −0.015 | 0 | 0 | 0 |
| 1 | +0.000013 | −0.013 | 0 | 0 | 0 |
| 2 | +0.000009 | −0.009 | 1 | 0 | 1 |
| ... | ... | ... | ... | ... | ... |
| t | +0.000003 | −0.003 | 755 | 751 (DIFFERENCE : −4) | 756 (DIFFERENCE : +1) |
| ... | ... | ... | ... | ... | ... |
| T | +0.000000 | +0.00 | 1034 | 1028 (DIFFERENCE : −6) | 1035 (DIFFERENCE : +1) |

▨ : TIME INTERVAL ALLOWING ACCESS OF TASK OTHER THAN TASK 401
W : TIME INTERVAL ALLOWING ACCESS OF TASK 401 ONLY

F I G . 1 8
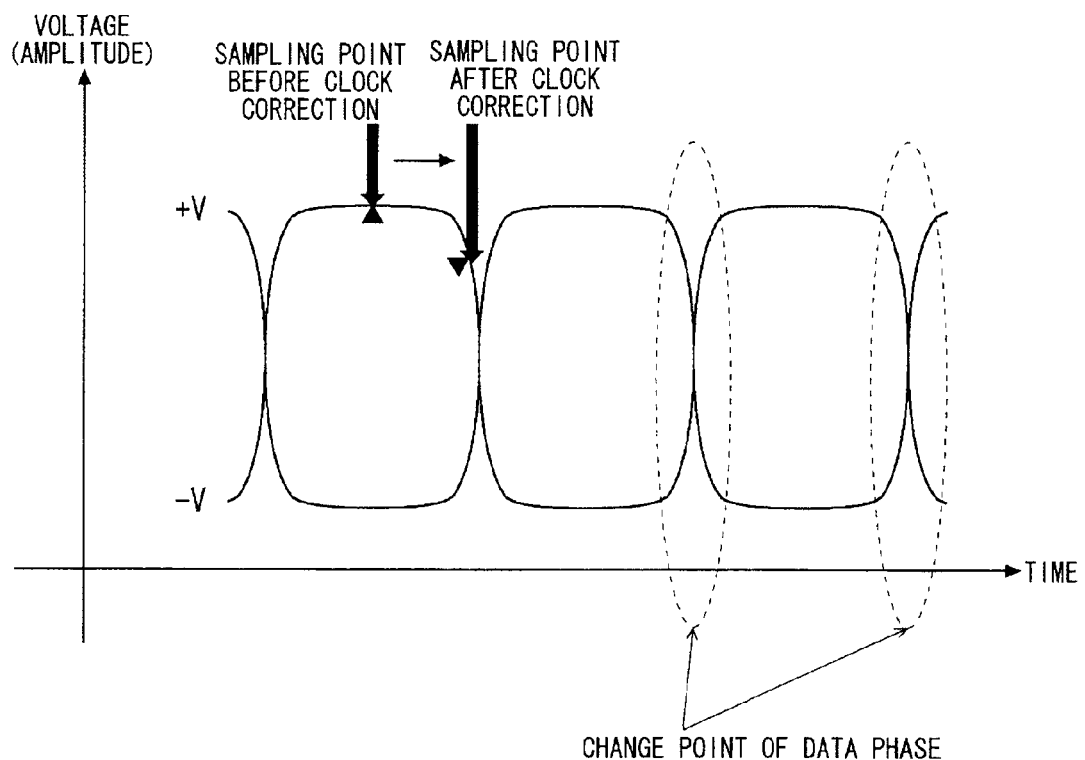

WIRELESS BASE STATION WITH INTERNAL CLOCK CORRECTION

TECHNICAL FIELD

The present invention relates to a wireless base station connected to a time information notification server and performing wireless communication with a mobile terminal.

BACKGROUND ART

A high accuracy is required in an oscillation frequency of a clock signal generation device applied to a wireless base station. For example, according to the W-CDMA scheme (3GPP TS25.141 (Non-Patent Document 1)), an accuracy of ±0.05 ppm is required.

To satisfy the accuracy, a wireless base station is proposed including: a voltage control oscillation section that outputs a clock signal having an oscillation frequency corresponding to a control voltage inputted to clock signal generation means of the wireless base station; a time information generation section that generates time information based on the clock signal outputted from the voltage control oscillation section; a time information comparison section that compares the time information generated by the time information generation section with reference time information; and a control voltage specifying section that specifies, to the voltage control oscillation section, a control voltage in accordance with a result of the comparison made by the time information comparison section (for example, see Patent Document 1). In the wireless base station, the time information generated based on the clock signal outputted from the voltage control oscillation section is compared with the reference time information that is not influenced by elapse of time, and the control voltage in accordance with the result of the comparison is specified to the voltage control oscillation section, and thereby the voltage control oscillation section corrects an oscillation frequency. This can keep the oscillation frequency of the clock signal simple and highly accurate.

Also proposed is a base station synchronization system including a plurality of base stations and a synchronization control device that makes a control for synchronizing the plurality of base stations with one another, the base station synchronization system being capable of suppressing a phase difference among master clocks of the base stations and accurately synchronizing the base stations with one another (for example, see Patent Document 2). In this system, the synchronization control device includes a control information generation section that generates synchronization control information for synchronizing the master clocks of the plurality of base stations with one another. The base station includes a master clock generation section that oscillates at a frequency corresponding to an inputted control voltage, and a control voltage correction section that corrects the control voltage inputted to the master clock generation section in accordance with the synchronization control information generated by the synchronization control device.

PRIOR-ART DOCUMENTS

Patent Documents

Patent Document 1: International Publication WO2006/064572
Patent Document 2: International Publication WO2006/082628

Non-Patent Documents

Non-Patent Document 1: 3GPP TS 25.141 (6.3 Frequency Error)

SUMMARY OF THE INVENTION

Problems to be Solved by the Invention

In the wireless base stations disclosed in the Patent Documents 1 and 2, the time information is compared with the reference time information which is not influenced by elapse of time, and the control voltage in accordance with the result of the comparison is specified to the voltage control oscillation section. An NTP (Network Time Protocol) server may be mentioned as an equipment having reference time information not influenced by elapse of time. However, in a case where the NTP server falls into an abnormal state to cause an error in the reference time information, the wireless base station mistakenly controls the clock signal. Moreover, the wireless base station cannot identify whether or not the reference time information is incorrect.

An object of the present invention is to provide a wireless base station capable of keeping an internal clock highly accurate even in a case where a malfunction occurs in an external time information notification server such as an NTP server.

Means for Solving the Problems

A wireless base station according to the present invention is a wireless base station connected to a plurality of time information notification servers and performing wireless communication with a mobile terminal. The wireless base station includes: a time information selection section (2-4) selecting any of a plurality of pieces of time information notified from the plurality of time information notification servers, respectively; and a clock correction section (2-5) correcting an internal clock based on the selected piece of time information.

Effects of the Invention

In the present invention, any of the plurality of pieces of time information notified from the plurality of time information notification servers, respectively, is selected, and the internal clock is corrected based on the selected piece of time information. This can keep the internal clock of the wireless base station highly accurate.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5 A diagram showing a configuration of a clock correction system according to an embodiment 3 of the present invention.

FIG. 9 A diagram showing data of start-up characteristics of a clock oscillator stored in a table.

FIG. 10 A diagram for explaining an operation of a base station 30 according to the embodiment 3 of the present invention.

FIG. 18 A diagram showing an example of an eye pattern of a reception signal of the base station according to the embodiment 5 of the present invention.

EMBODIMENT FOR CARRYING OUT THE INVENTION

Embodiment 1

Figures 1, 2:
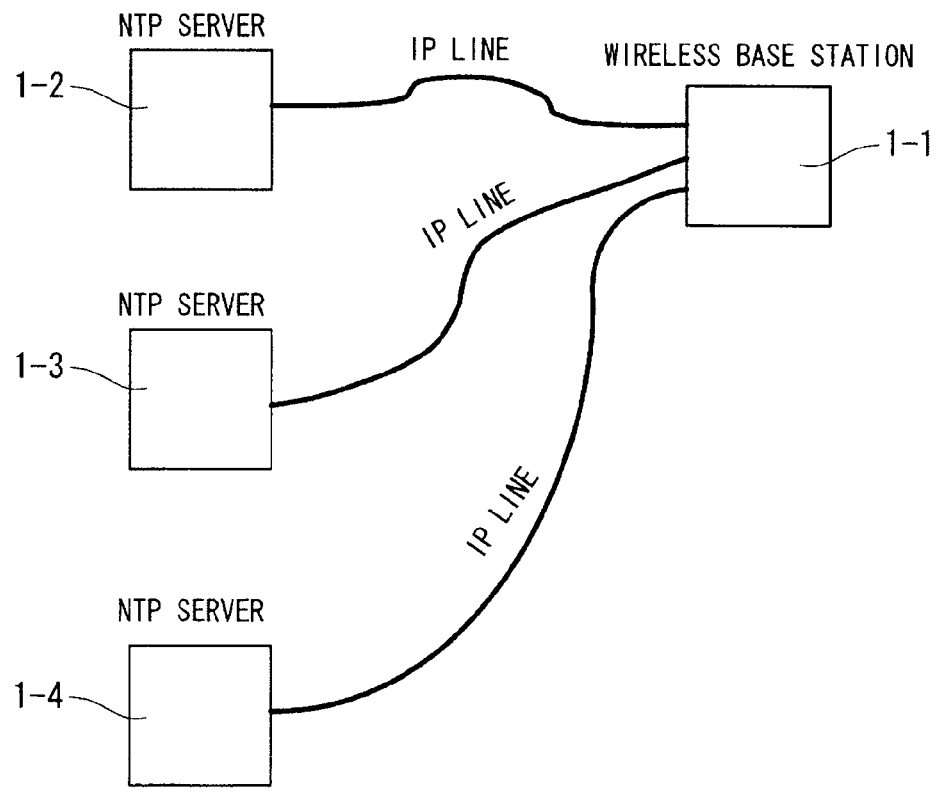
FIG. 1 A diagram showing a configuration of a network according to an embodiment 1 of the present invention.
FIG. 2 A diagram showing a first example of time information supplied from a plurality of time information notification servers and time information inside a wireless base station.

FIG. 1 shows an embodiment 1 of the present invention. FIG. 1 shows a clock correction system including a wireless base station, and three NTP servers (time information notification servers) connected to the wireless base station via IP lines.

As shown in FIG. 1, the clock correction system includes a wireless base station (base station) 1-1 and NTP servers 1-2 to 1-4. The NTP servers 1-2, 1-3, and 1-4 independently generate reference time information not synchronized with one another.

Next, an operation of the clock correction system will be described. In FIG. 1, the wireless base station 1-1 is connected to the three NTP servers 1-2 to 1-4, and receives, as reference time information, time information from each of the NTP servers 1-2 to 1-4. The base station 1-1 sequentially receives time notification pulses of each of the NTP servers 1-2 to 1-4, and obtains a difference among them, to recognize a time interval. Here, in a case where there is a malfunction in the NTP server 1-3 or there is a failure in the IP line connected to the NTP server 1-3, a significant difference occurs between a time interval calculated based on the time notification pulses notified from each of the NTP servers 1-2 and 1-4 to the base station 1-1 and a time interval calculated based on the time notification pulse notified from the NTP server 1-3 to the base station 1-1.

In the system of FIG. 1, it is assumed that the base station 1-1 operates at 19.2 MHz and generates an internal pulse once in 10000 master clocks. It is also assumed that each of the NTP servers 1-2 to 1-4 transmits the pulse to the base station at time intervals of 19.2 MHz×10000 clocks.

Using the master clock, the base station 1-1 counts the number of clocks occurring in a time period elapsed from one pulse to the next pulse, with respect to each of the NTP servers 1-2 to 1-4. The count value corresponds to a pulse interval. The base station 1-1 detects a malfunction of the NTP servers 1-2 to 1-4 based on information of the pulse interval, and performs a correction (hereinafter also referred to as a "clock correction") on an oscillation frequency of the master clock with reference only to the reference time information of the NTP servers with the exclusion of the malfunctioning NTP server.

For example, it is assumed that, at a certain time point, the pulse interval (count value) of the NTP server 1-2 is 9999 clocks, the pulse interval of the NTP server 1-3 is 9999 clocks, and the pulse interval of the NTP server 1-4 is 10300 clocks, as shown in FIG. 2. Only the interval of the pulses given from the NTP server 1-4 exhibits a difference of as many as 300 clocks relative to the interval of the internal pulses of the base station 1-1. Each of the NTP servers 1-2 and 1-3 exhibits a difference of 1 clock. In this case, the base station 1-1 determines that the pulses given from the NTP servers 1-2 and 1-3 having a pulse interval of 9999 clocks are correct, and controls a control voltage of a voltage controlled oscillator that generates the master clock, such that the interval of the internal pulses can be equal to 9999 clocks.

In this manner, the base station 1-1 identifies correct time information of the NTP server, and thereby operates so as not to refer to the reference time information given from the malfunctioning NTP server.

Figures 3, 4:
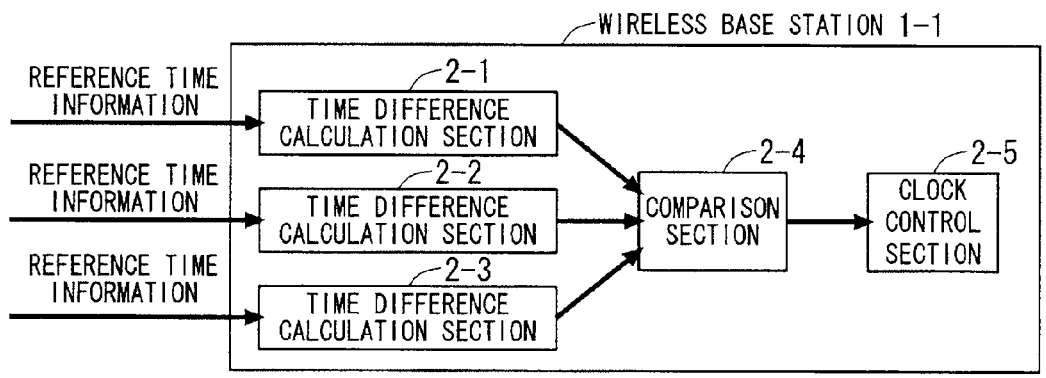
FIG. 3 A diagram showing a second example of the time information supplied from the plurality of time information notification servers and the time information inside the wireless base station.
FIG. 4 A diagram showing a configuration of a wireless base station according to an embodiment 2 of the present invention.

For example, it is assumed that the pulse interval (count value) of the NTP server 1-2 is 9998 clocks, the pulse interval of the NTP server 1-3 is 9999 clocks, and the pulse interval of the NTP server 1-4 is 10300 clocks, as shown in FIG. 3. In such a case where the pulse intervals of the NTP servers 1-2, 1-3, and 1-4 are all different from one another, the base station 1-1 firstly determines not to refer to the reference time information given from the NTP server 1-4 whose pulse interval exhibits the largest difference relative to the internal pulse interval. Then, the base station 1-1 compares the pulse intervals of the NTP servers 1-2 and 1-3 with each other, and determines to refer to the reference time information given from the NTP server 1-3 whose pulse interval is closest to the internal pulse interval of the base station 1-1. In other words, in a case where the reference time information of each NTP server and internal time of the base station are difference from each other, the base station 1-1 assumes that the reference time information given from the NTP server is correct, and determines that the reference time information given from the NTP server whose pulse interval is closest to the internal pulse interval of the base station is the most accurate time information. Then, the base station 1-1 performs the correction (clock correction) on the oscillation frequency of the master clock with reference to the reference time information determined to be the most accurate time information.

In this manner, in the clock correction system according to this embodiment, a plurality of NTP servers are provided, and thereby a failure in the NTP server can be detected. The base station determines that the reference time information given from the NTP server whose time information is closest to the internal time of the base station is correct time information. This can minimize an influence of a significant error in the time information caused by a failure of the NTP server. Thus, the clock control can be stably performed with a high accuracy without any influence of the malfunction of the NTP server.

In an operation performed by the base station for detecting a malfunction of the NTP server, a threshold value may be set in the pulse interval (count value) of the NTP server, and it may be determined that an NTP server exhibiting a difference equal to or larger than the threshold value is malfunctioning or failed, so that consequently the time information transmitted from this NTP server is excluded from reference time information used for the clock correction. In this case, for example, if all NTP servers have pulse intervals exhibiting a difference equal to or larger than the threshold value relative to the internal pulse interval of the base station, it is determined that all the NTP servers are malfunctioning, and no clock correction is performed. This can prevent the clock control from being performed on the base station based on incorrect reference time information in a case where all the NTP servers are failed.

Embodiment 2

FIG. 4 shows a configuration of performing the clock correction in the wireless base station connected to the plurality of NTP servers.

The wireless base station 1-1 includes time difference calculation sections 2-1, 2-2, and 2-3 receiving pulse signals from the NTP servers 1-2, 1-3, and 1-4 (not shown in FIG. 4), respectively, and calculating pulse intervals of the pulse signals; a comparison section 2-4 (time information selection section) comparing the pulse intervals calculated by the time difference calculation sections 2-1, 2-2, and 2-3 with one another, and determining and selecting the most accurate reference time information; and a clock control section 2-5 controlling the oscillation frequency of the master clock (internal clock).

Each of the NTP servers 1-2, 1-3, and 1-4 transmits a pulse signal corresponding to the reference time information, at regular intervals. The time difference calculation section 2-1 receives the pulse signal from the NTP server 1-2, and calculates a time interval (time difference) between a pulse arriving at a certain time point and a subsequently arriving pulse, to thereby calculate a pulse interval between them. The time difference calculation section 2-2 receives the pulse signal from the NTP server 1-3, and calculates a pulse interval thereof. The time difference calculation section 2-3 receives the pulse signal from the NTP server 1-4, and calculates a pulse interval thereof.

The comparison section 2-4 arranges the pulse intervals of the NTP servers 1-2, 1-3, and 1-4 which are calculated by the time difference calculation sections 2-1, 2-2, and 2-3, in the manner as shown in FIGS. 2 and 3, and determines which NTP server is transmitting the most accurate pulse signal (that is, the most accurate reference time information). Thus, the comparison section 2-4 functions also as a time accuracy identification section that identifies the accuracy of the time information given from each of the NTP servers 1-2, 1-3, and 1-4.

The clock control section 2-5 corrects the control voltage of the voltage controlled oscillator that generates the master clock within the base station 1-1, based on the reference time information that has been determined as the most accurate by the comparison section 2-4. Thereby, the accuracy of the master clock is increased. Thus, the clock control section 2-5 functions as a clock correction section that corrects the oscillation frequency of the master clock.

In this manner, in the base station 1-1 of FIG. 4, in each of the time difference calculation sections 2-1, 2-2, and 2-3, the reference time information received from each of the NTP servers 1-2, 1-3, and 1-4 is converted into a time difference (pulse interval) that is on a clock basis. In the comparison section 2-4, these time differences are arranged as shown in FIGS. 2 and 3, and compared with the internal pulse interval of the base station 1-1, to thereby determines the most accurate reference time information. A manner of the determination in the comparison section 2-4 is such that the reference time information of the NTP server having the number of clocks (count value) closest to the number of clocks corresponding to the internal pulse interval of the base station 1-1 is determined to be the most accurate reference time information.

In the determination in the comparison section 2-4, the NTP server in which the number of clocks exhibits a difference equal to or larger than a predetermined threshold value (for example, 300 clocks) relative to the number of clocks in the base station 1-1 may be determined as malfunctioning or being failed. Then, the time information transmitted therefrom may be preliminarily excluded from the reference time information used for the clock correction. In this case, the comparison section 2-4 functions also as a malfunction detection section that detects a malfunctioning NTP server. For example, if all of the NTP servers 1-2, 1-3, and 1-4 fall into a failed state, it is determined that all of them are malfunctioning, and no clock correction is performed. This can avoid the clock control being performed incorrectly.

The clock control section 2-5 refers to the reference time information that has been determined as the most accurate by the comparison section 2-4, and controls the oscillation frequency of the master clock of the base station 1-1 based on a table of correspondence with the control voltage of the voltage controlled oscillator.

The base station according to this embodiment exerts an effect that the accuracy of the master clock can be kept high without any influence of a malfunction of the NTP server caused by a failure.

Embodiment 3

In an embodiment 3, start-up device characteristics of a clock oscillator are preliminarily recognized by the base station, and at a time of an actual start-up, the base station performs correction (clock correction) on the oscillation frequency of the master clock based on the device characteristics. This enables the base station itself to stably produce highly reliable time information. Thus, the base station can identify the reliability of the plurality of NTP servers by using the highly reliable time information.

FIG. 5 is a diagram showing a base station 30 according to the embodiment 3. The base station 30 is applicable to the clock correction system according to each of the above-described embodiments.

The base station 30 according to this embodiment includes a clock oscillator 31 which is a voltage controlled oscillator that generates the master clock, a clock control section 32 which controls the control voltage of the clock oscillator 31, and thereby controls the oscillation frequency of the master clock, and a table 33 which stores start-up characteristics (characteristics at a time of power on) of the clock oscillator 31 in a quantified form. The clock control section 32 is operable to correct the oscillation frequency of the master clock with reference to the reference time information given from the NTP server. At the time of power on, the clock control section 32 performs the correction based on information of the start-up characteristics of the clock oscillator 31 stored in the table 33.

The information of the start-up characteristics of the clock oscillator 31 stored in the table 33 is data indicating a change of an error in the master clock frequency at the time of start-up of the base station 30 (at the time of power-on of the clock oscillator 31). The data is obtained as a result of measurement performed in a manufacturing process of the clock oscillator 31, and unique to each device.

Figure 6:
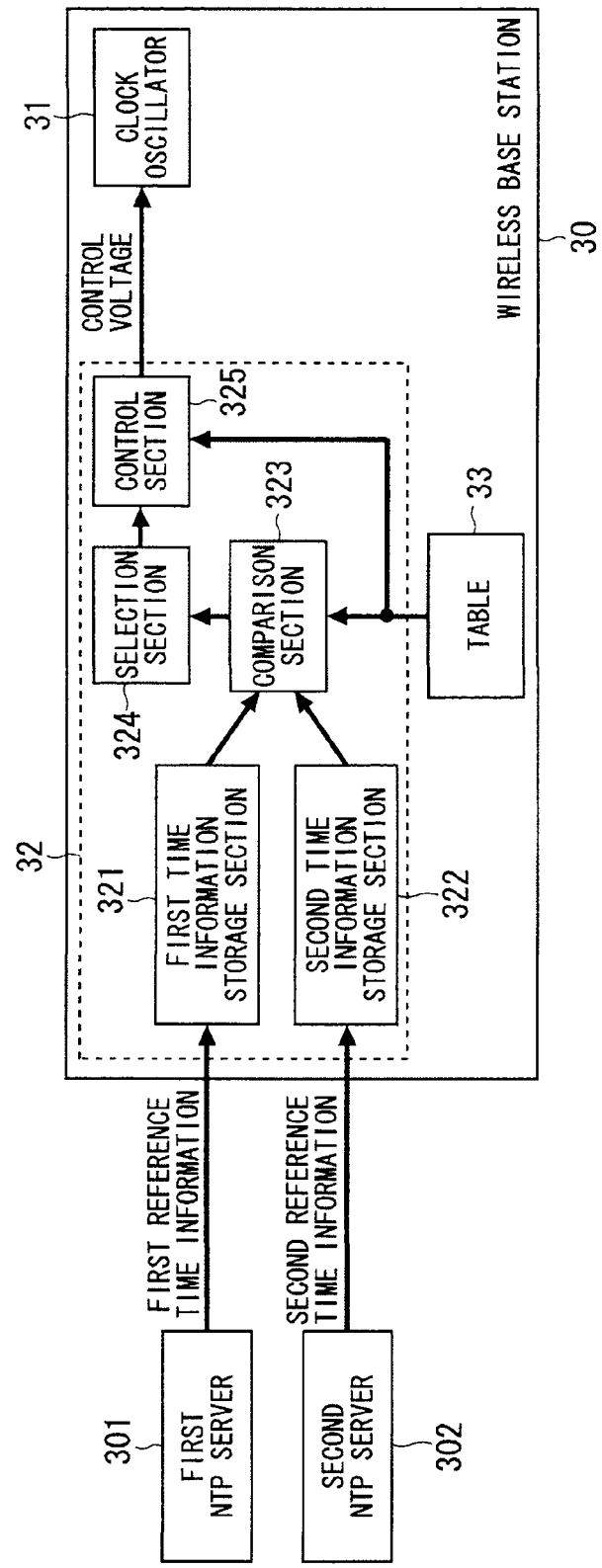
FIG. 6 A diagram showing a configuration of the clock correction system according to the embodiment 3 of the present invention.

FIG. 6 is a diagram representing the clock control section 32, is divided into a plurality of functional blocks, of the base station 30 shown in FIG. 5. As shown in FIG. 6, the clock control section 32 includes first and second time information storage sections 321 and 322, a comparison section 323, a selection section 324, and a control section 325.

The base station 30 according to this embodiment obtains, as the reference time information, pieces of time information of two NTP servers 301 and 302. The first time information storage section 321 of the clock control section 32 stores the time information (first reference time information) given from the first NTP server 301, and the second time information storage section 322 stores the time information (second reference time information) given from the second NTP server 302. The comparison section 323 compares the accuracy of the first reference time information and the accuracy of the second reference time information with each other. At the time of start-up of the base station 30, the comparison process is performed by using the data of the start-up characteristics of the clock oscillator 31 stored in the table 33.

The selection section 324 selects more accurate one of the first second reference time information, based on a result of the comparison performed by the comparison section 323, and transmits it to the control section 325. The control section 325 performs the clock correction by adjusting the control voltage to be supplied to the clock oscillator 31 based on the time information selected by the selection section 324.

Figures 7, 8:
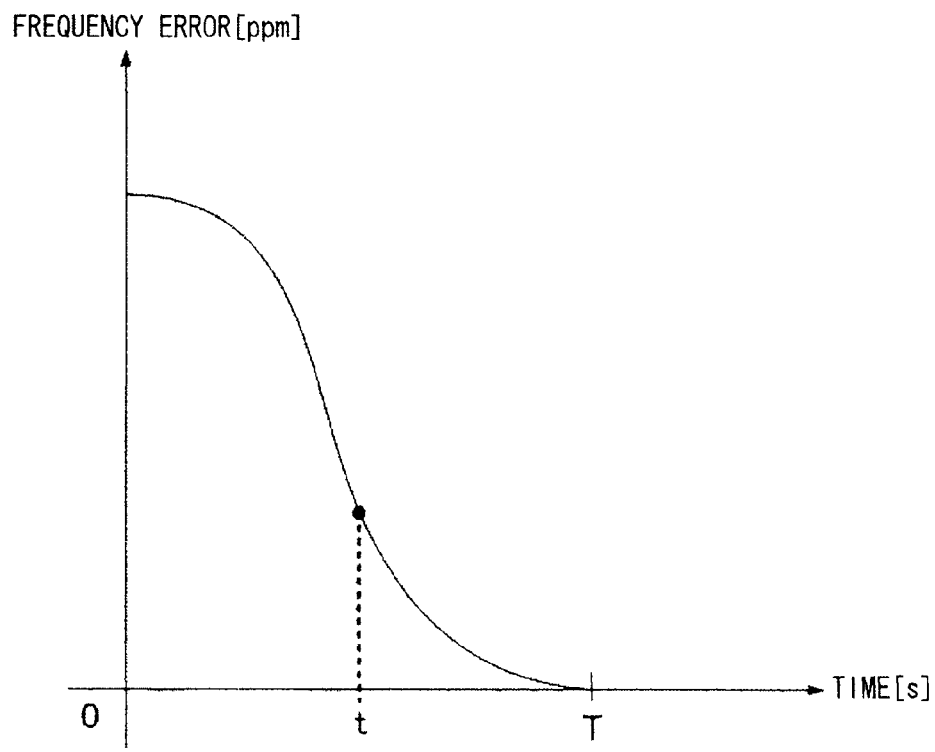
FIG. 7 A diagram showing start-up characteristics of a clock oscillator according to the embodiment 3 of the present invention.
FIG. 8 A diagram showing data of the start-up characteristics of the clock oscillator according to the embodiment 3 of the present invention.

FIG. 7 shows the start-up characteristics in a time period from the time of start-up (power-on) of the clock oscillator 31 to a time (T) when the frequency of the master clock, which is an output of the clock oscillator 31, is stabilized. FIG. 7 represents a change of an error relative to a prescribed frequency of the master clock. FIG. 8 shows the start-up characteristics of FIG. 7 in a quantified form. The "TIME" in FIG. 8 is zero at the time of start-up, and counted up upon each predetermined number of clocks (for example, 100 master clocks).

FIG. 9 shows data stored in the table 33 in a case where the clock oscillator 31 has the start-up characteristics of FIG. 8. In this example, it is assumed, when the control voltage of the clock oscillator 31 is increased or decreased by 1 mV, the oscillation frequency is accordingly increased or decreased by 1 kHz. The control section 325 adjusts the control voltage of the clock oscillator 31 based on the data at the time of start-up, and thereby corrects an error in the oscillation frequency of the master clock due to the start-up characteristics.

For example, at a time point t, the clock oscillator 31 has an error of +3 kHz as shown in FIG. 8. At this time, the control section 325 refers to the data (FIG. 9) of table 33, and inputs a control voltage of −3 mV to the clock oscillator 31. This lowers the oscillation frequency of the clock oscillator 31 by 3 kHz, and corrects the above-mentioned error.

FIG. 10 shows an exemplary operation of the base station 30 according to the embodiment 3. An operation of the base station 30 will be described with reference to FIG. 10.

Here, the comparison section 323 includes three counters that receive the master clock generated by the clock oscillator 31, a pulse signal (corresponding to the first reference time information) given from the first NTP server 301, and a pulse signal (corresponding to the second reference time information) given from the second NTP server 302, respectively. Each of the three counters counts up upon each particular number of clocks. The three counters are set such that they all can count up at the same timing in an ideal case where there is no error in the master clock, the first reference time information, and the second reference time information.

When the base station 30 starts up, the control section 325 refers to the data of the table 33, and controls the clock oscillator 31 based on the data, to thereby correct the error in the oscillation frequency of the master clock due to the start-up characteristics. The comparison section 323 compares a count value C0 which is based on the master clock in which the error due to the start-up characteristics is corrected, a count value C1 which is based on the pulse signal (corresponding to the first reference time information) given from the first NTP server 301, and a count value C2 which is based on the pulse signal (corresponding to the second reference time information) given from the second NTP server 302, with one another.

Based on a result of the comparison, the selection section 324 determines that one of the count values C1 and C2 that has a smaller difference relative to the count value C0 is correct reference time information, and transmits the correct one of the first reference time information and the second reference time information to the control section 325. At a time point t of FIG. 10, using the count value C0 as a reference, the count value C1 has a difference of −4 and the count value C2 has a difference of +1. Therefore, the second reference time information is selected and transmitted to the control section 325. The control section 325 corrects the oscillation frequency of the master clock generated by the clock oscillator 31, based on the reference time information received by the selection section 324.

In the base station 30 according to this embodiment, more correct reference time information can be referred to without an influence of an error in the frequency of the master clock due to the start-up characteristics of the clock oscillator 31. This enables the clock oscillator 31 to stably generate a correct master clock immediately after the start-up.

Figure 11:
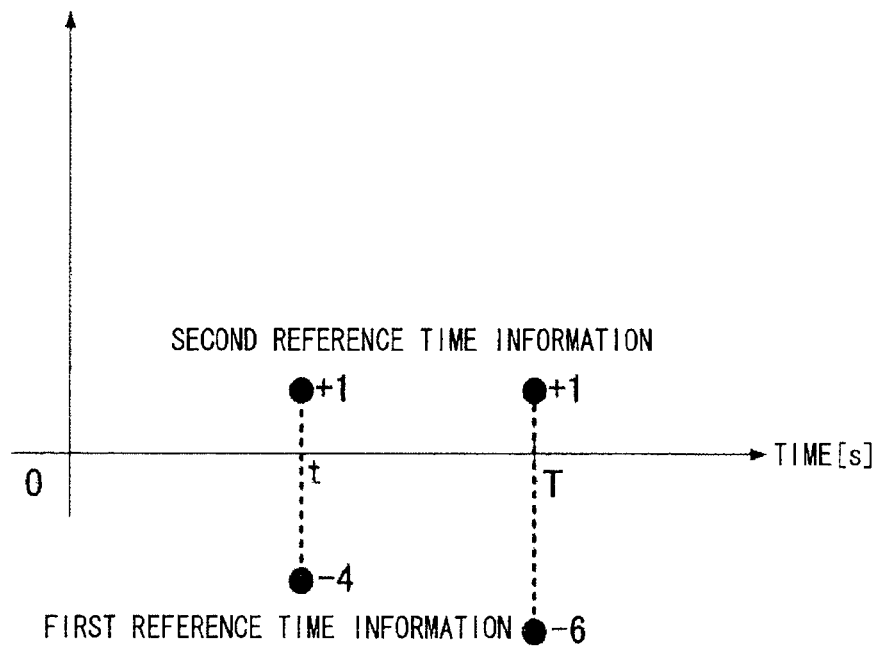
FIG. 11 A diagram for explaining the operation of the base station 30 according to the embodiment 3 of the present invention.

Although in the above description, it is determined that one of the count values C1 and C2 that has a smaller difference relative to the count value C0 is the correct reference time information, a method of the determination is not limited thereto. For example, it may be determined that one of the count values C1 and C2 that exhibits a smaller variation in the difference is the correct reference time information. In the example of FIG. 10, as shown in FIG. 11, the count value C1 has a difference of −4 at the time point t and the difference increases to −6 at the time point T, while the count value C2 has a difference of +1 at both time points t and T, without a variation in the difference. From this result, the second reference time information having a smaller variation is determined to be the accurate time information, and subsequently, the first reference time information is treated as auxiliary information.

Since the data of the table 33 is highly reliable information based on actual measured values, the data may sometimes be regarded as more accurate than the reference time information given from the NTP server. In such a case, in a time period from the start-up (time point 0) of the clock oscillator 31 to the time (time point T) of stabilization of the master clock, only the clock correction based on the data of the table 33 may be performed without performing a correction based on the reference time information given from the NTP server.

Embodiment 4

In order to keep the time information of the base station highly accurate, it is preferable to ensure that a process for the correction (clock correction) of the oscillation frequency of the master clock is performed in a predetermined cycle. However, in a case where a CPU (central processing unit) that controls an overall operation of the base station executes a plurality of tasks, it is conceivable that the process for the clock correction is interrupted by another process, so that the clock correction cannot be performed in a constant cycle. In this embodiment, a method of the clock correction for solving this problem will be shown.

In a case where the CPU of the base station concurrently executes a plurality of tasks, if a time of access of each task to another device is not adjusted, "competition" occurs in which the tasks simultaneously access to the same device. For example, if an access competition occurs, a timing of write-in/read-out of data may be delayed, or the read-out may be failed to notify another task of wrong data.

Figure 12:
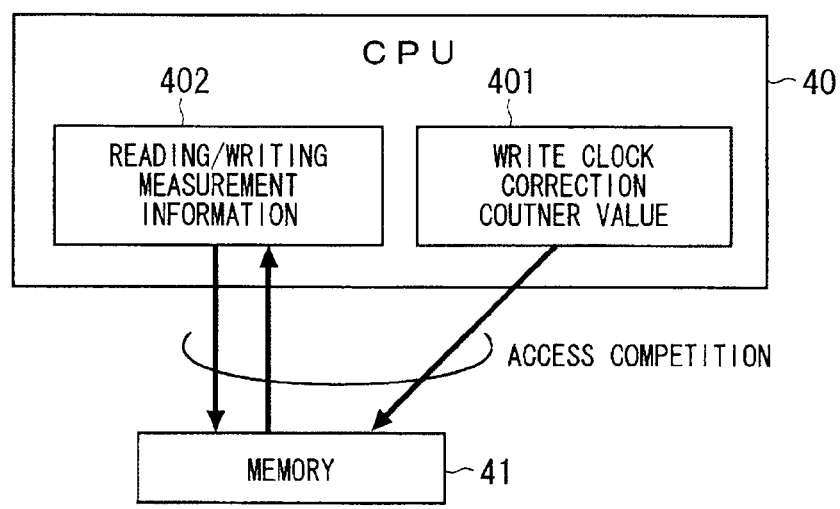
FIG. 12 A diagram showing an example of competing tasks in the base station.
Figure 13:
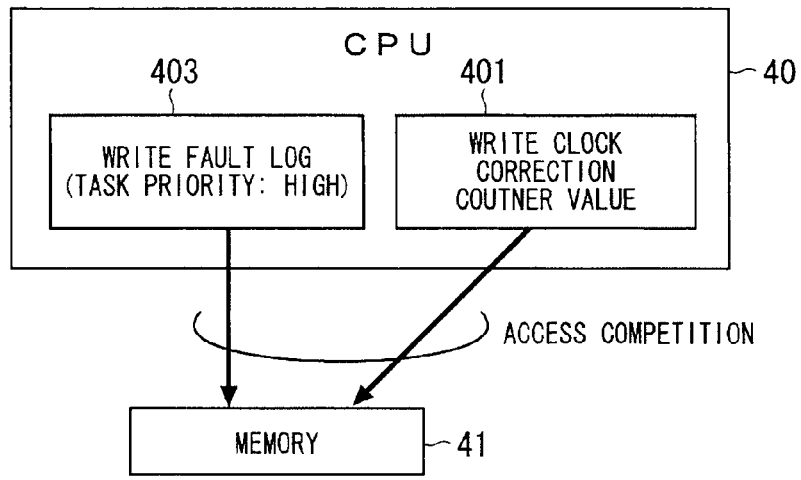
FIG. 13 A diagram showing an example of competing tasks in the base station.

More specifically, as shown in FIG. 12, in a case where a CPU 40 executes two tasks, one being a task 401 for writing a clock correction counter value (such as time information) into the memory 41 and the other being a task 402 for reading and writing measurement information (such as a reception level and an interference level of the wireless communication) out of and into the memory 41; accesses of these two tasks to the memory 41 may compete against each other. Moreover, for example, as shown in FIG. 13, in a case where the CPU 40 executes two tasks, one being the task 401 for writing the clock correction counter value into the memory 41 and the other being a task 403 for writing a fault log (such as debug information) into the memory 41; accesses of these two tasks to the memory 41 may compete against each other.

A specific of the access competition description will be given with reference to an example shown in FIG. 12. For example, it is assumed that the task 402 for reading and writing the measurement information is started, so that the task 402 starts writing the measurement information into the memory 41. At a time point when the task 402 issues an instruction to write into the memory 41, the CPU 40 determines the process is completed, and terminates the task.

Then, it is assumed that the task 401 for writing the clock correction counter value is started, so that the task 401 tries to write the clock correction counter value into the memory 41. At this time, in scheduling process of the CPU 40, the task 402 is already completed, but actually, the measurement information may be in the middle of the writing process because a certain time period is required for writing into the memory 41. Therefore, the task 401 cannot write the counter value into the memory 41 until the writing process is completed. Such a state is the access competition to the memory 41.

In this case, a timing when the task 401 writes the counter value is delayed, and thus the written counter value may not correctly reflect the time information of the base station. As a result, an incorrect clock correction may be performed. A method of clock correction using a counter is described in the above-mentioned Patent Document 2, too.

The aforesaid problem is caused by an overlap of access timings of accessing to the memory 41 between the task 401 for writing the clock correction counter value and another task. This problem may be caused not only when another task competing against the task 401 for writing the clock correction counter value is higher priority (FIG. 13), but also when the tasks have the same level of priority (FIG. 12).

If the timing of writing the clock correction counter value is delayed in this manner, the accuracy of the frequency of the master clock of the base station, in other words, the accuracy of the time information, deteriorates. Therefore, in this embodiment, for avoiding this situation, a time interval in which the task 401 for writing the clock correction counter value accesses the memory 41 and a time interval in which other tasks can access the memory 41 are separately provided.

Figure 14:
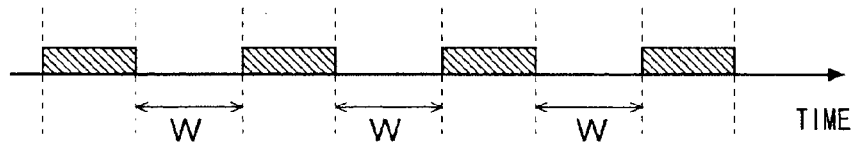
FIG. 14 A diagram for explaining an operation (a timing of clock correction) of a base station according to an embodiment 4 of the present invention.

To be more specific, as shown in FIG. 14, when a task (the task 402 for reading and writing the measurement information, or the task 403 for writing the fault log) other than the task 401 for writing the clock correction counter value writes into the memory 41, the writing is stopped at each certain data amount to provide a time interval in which the task does not access the memory 41. In this time interval, only the task 401 for writing the clock correction counter value is authorized to access the memory 41.

This can avoid competition between the access of the task 401 to the memory 41 and the access of another task, to allow the task 401 to write the counter value into the memory 41 in a certain cycle. The time interval in which the task 401 for writing the clock correction counter value can access the memory 41 is separate from the time interval in which the other tasks can access the memory 41. Therefore, even if a task of a higher priority than the task 401 is being executed, the task 401 can surely write the counter value into the memory 41. This can consequently prevent the base station from performing an erroneous clock correction, can thus can keep the accuracy of the time information high.

Here, in some base station, when the timing of writing the clock correction counter value is delayed by a certain time period or longer, a fault alarm is emitted and no correction process is performed, thereby preventing an erroneous clock correction. However, if the fault alarm is often emitted, the frequency of the clock correction is lowered, which deteriorates the reliability of the time information. Application of this embodiment to such a base station is advantageous in that a delay of writing of a counter value into a memory is prevented so that emission of the fault alarm can be prevented.

In this manner, when the process for the clock correction and another process are concurrently performed in the base station, the another process is stopped at regular intervals and the process for the clock correction is performed during the stop, to thereby ensure that the clock correction is performed in a certain cycle so that the base station can keep the accuracy of the time information high.

Embodiment 5

In an embodiment 5, a technique is proposed of controlling a timing when the base station performs the correction (clock correction) on the oscillation frequency of the master clock. In this embodiment, in a case where a process that may cause a malfunction if the clock correction is performed in the middle of the process is being performed, the clock correction is inhibited until the process is completed. Since the clock correction is performed at such a timing that a malfunction is not likely to occur, a deterioration in the reception performance and the throughput can be suppressed so that the operation of the base station can be kept stable.

Figure 15:
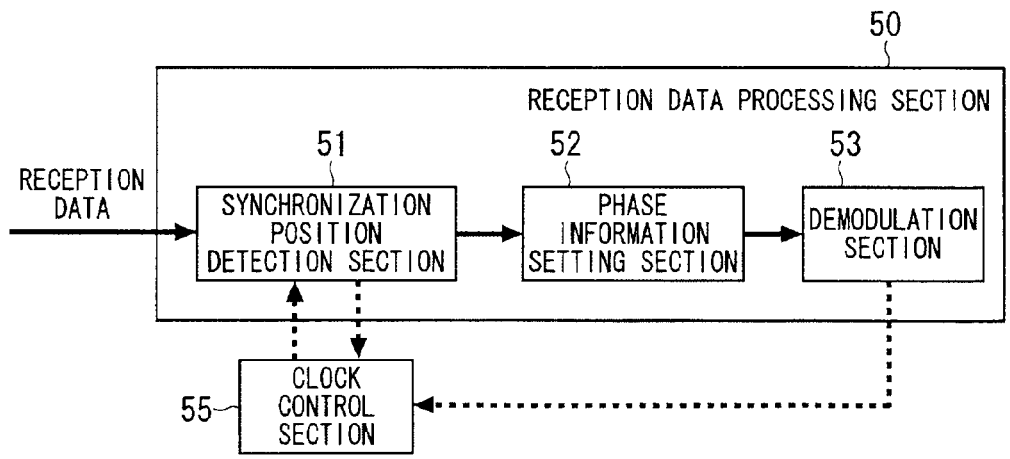
FIG. 15 A block diagram showing a reception data processing section and a clock control section in a base station according to an embodiment 5 of the present invention.

FIG. 15 is a block diagram showing a reception data processing section and a clock control section in the base station according to the embodiment 5. The reception data processing section 50 serves to demodulate data (reception data) received by the base station. As shown in FIG. 15, the reception data processing section 50 includes a synchronization position detection section 51, a phase information setting section 52, and a demodulation section 53. The synchronization position detection section 51 detects a timing (synchronization position) of the reception data. The phase information setting section 52 sets a demodulation processing timing for demodulating the reception data, so as to correspond to the timing of the reception data. The demodulation section 53 performs a demodulation process on the reception data based on the demodulation timing set.

The reception data processing section 50 notifies a clock control section 55 (clock correction section) that performs the clock correction on the base station, of information of whether or not the synchronization position detection section 51 has detected the synchronization position and whether or not the demodulation section 53 has performed the demodulation process. The clock control section 55 performs the clock correction at a timing determined based on the information.

Operations of the reception data processing section 50 and the clock control section 55 shown in FIG. 15 will be described. The synchronization position detection section 51 detects (so-called "path detection") the head of a frame format of the reception data and synchronization information on a bit level, to thereby detect the synchronization position of the reception data. The phase information setting section 52 sets, to the demodulation section 53, information of the detected synchronization position of the reception data. Based on the information, the demodulation section 53 is synchronized with the reception data and performs a carrier recovery on the reception data by using a known signal, thus removing a distortion of data due to a wireless transmission path.

Figure 16:
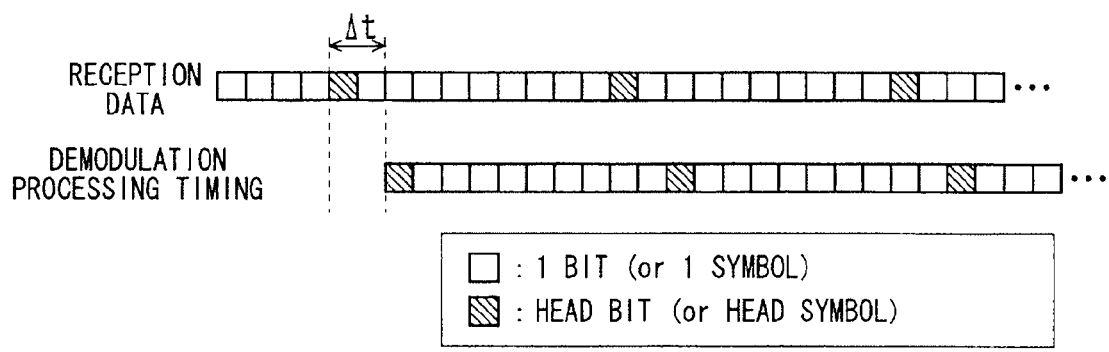
FIG. 16 A diagram for explaining a problem that occurs when clock correction is performed in a demodulation process for demodulating reception data.

If the clock correction is performed in the middle of this series of demodulation operations (during a time period from when the synchronization position is detected to when the demodulation process using the information thereof is completed), a path position detected by the synchronization position detection section 51 may be shifted so that the timing of the reception data recognized by the demodulation section 53 may be different from the actual one. As a result, as shown in FIG. 16, the timing of the reception and the timing of the demodulation process may be misaligned with each other by a time period Δt, causing an erroneous demodulation process to be performed. Alternatively, as shown in FIG. 18, in an eye pattern of the reception data, a sampling may be performed at a point where the phase of the reception data changes, to cause an erroneous determination of the data.

Therefore, in this embodiment, the clock control section 55 is inhibited from performing the clock correction during a time period from when the synchronization position detection section 51 detects the synchronization position to when the demodulation section 53 completes the demodulation process using the synchronization position. More specifically, the synchronization position detection section 51 transmits to the clock control section 55 a notification signal indicating the synchronization position of the reception data is detected, and the demodulation section 53 transmits, to the clock control section 55, a notification signal indicating that the demodulation process on the reception data is completed. During a time period from receiving the notification signal from the synchronization position detection section 51 to when receiving the notification signal from the demodulation section 53, the clock control section 55 receives determines that it is a time interval for inhibiting the clock correction, and performs no clock correction.

Then, in a time period from when the demodulation process in the demodulation section 53 is completed to when the synchronization position detection section 51 starts detecting the synchronization position of the next reception data, the clock control section 55 can perform the clock correction. More specifically, after receiving the notification signal from the demodulation section 53, the clock control section 55 performs the clock correction as necessary and transmits, to the synchronization position detection section 51, the notification signal indicating that the clock correction process is completed (this notification signal is transmitted to the synchronization position detection section 51 also when there is no need to perform the clock correction). After receiving the notification signal from the clock control section 55, the synchronization position detection section 51 starts detecting the synchronization position of the next reception data.

Since the reception data is successively transferred or burst-transferred, the above-described process is repeatedly performed in the base station.

Figure 17:
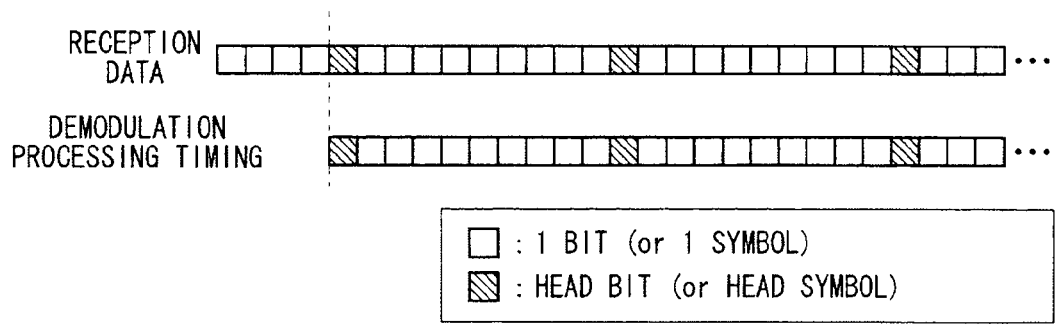
FIG. 17 A diagram for explaining an effect of the base station according to the embodiment 5 of the present invention.

In this embodiment, the clock correction is inhibited during the time period from when the synchronization position of the reception data is detected to when the demodulation process is completed. This can prevent the timing of the reception data and the timing of the demodulation process from being misaligned with each other due to the clock correction. Thus, as shown in FIG. 17, the demodulation process can be surely performed at a timing properly synchronized with the reception data. Alternatively, a shift of the sampling described in FIG. 18 can also be suppressed, thus preventing an erroneous determination of the data.

In the above description, the timing control of the clock correction in the clock control section 55 is performed using two notification signals given from the synchronization position detection section 51 and the demodulation section 53. However, only one flag signal may be simply used to perform the timing control. To be specific, a flag signal that is set at a H (High) level during the time period from when the synchronization position detection section 51 detects the synchronization position of the reception data to when the demodulation section 53 completes the demodulation process on the reception data and brought into a L (Low) level in the other periods may be transmitted from the reception data processing section 50 to the clock control section 55, so that the clock control section 55 performs the clock correction only when the flag signal is at the L level. This can simplify the process.

The method for controlling the clock correction timing according to this embodiment is applicable to the clock correction system according to each one of the above-described embodiments.

While the invention has been described in detail, the foregoing description is in all aspects illustrative and not restrictive. It is therefore understood that numerous modifications and variations can be devised without departing from the scope of the invention.

DESCRIPTION OF THE REFERENCE NUMERALS

1-1 base station; 1-2, 1-3, 1-4 NTP server; 2-1, 2-2, 2-3 time difference calculation section; 2-4 comparison section; 2-5 clock control section; 31 clock oscillator; 32 clock control section; 33 table; 30 base station; 301 first NTP server; 302 second NTP server; 321 first time information storage section; 322 second time information storage section; 323 comparison section; 324 selection section; 325 control section; 40 CPU; 41 memory; 401 task for writing clock correction counter value; 402 task for reading/writing measurement information; 403 task for writing fault log; 50 reception data processing section; 51 synchronization position detection section; 52 phase information setting section; 53 demodulation section; 55 clock control section

The invention claimed is:

1. A wireless base station connected to a plurality of time information notification servers and performing wireless communication, said wireless base station comprising:
 a time information selection section selecting any of a plurality of pieces of time information notified from said plurality of time information notification servers, respectively;
 a clock correction section correcting an internal clock based on said selected piece of time information; and
 a malfunction detection section detecting a malfunction of said plurality of time information notification servers, wherein
 said malfunction detection section detects a malfunction of said time information notification servers by comparing a count value obtained by measuring an interval of pulses transmitted from said time information notification servers with a predetermined threshold value,
 said time information selection section excludes, from options, the piece of time information notified from the time information notification server of which a malfunction is detected by said malfunction detection section.

2. The wireless base station according to claim 1, further comprising a time accuracy identification section identifying the accuracy of each of said plurality of pieces of time information notified from said plurality of time information notification servers, respectively, wherein
 said time information selection section selects the piece of time information based on a result of the identification made by said time accuracy identification section.

3. The wireless base station according to claim 2, wherein said time accuracy identification section identifies the accuracy of said plurality of pieces of time information by using, as a reference, the frequency of said internal clock in which a frequency error due to start-up characteristics of an oscillator of said internal clock has been corrected.

4. The wireless base station according to claim 1, wherein a process other than a process for correcting said internal clock is stopped at regular intervals such that said process for correcting said internal clock can be performed in a certain cycle.

5. The wireless base station according to claim 4, wherein said process for correcting said internal clock includes a task for writing a counter value for internal clock correction.

6. The wireless base station according to claim 1, wherein said clock correction section comprises means for determining whether or not a particular process is being performed, and does not correct said internal clock while said particular process is being performed.

7. The wireless base station according to claim 6, wherein said particular process includes a demodulation process for demodulating reception data.

* * * * *